United States Patent [19]
Kook et al.

[11] Patent Number: 6,008,123
[45] Date of Patent: *Dec. 28, 1999

[54] METHOD FOR USING A HARDMASK TO FORM AN OPENING IN A SEMICONDUCTOR SUBSTRATE

[75] Inventors: Taeho Kook; Alvaro Maury; Kurt G. Steiner; Tungsheng Yang, all of Orlando, Fla.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/963,687

[22] Filed: Nov. 4, 1997

[51] Int. Cl.$^6$ .................................................. H01L 21/8242
[52] U.S. Cl. ......................... 438/639; 438/240; 438/254; 438/397; 438/947; 438/625; 438/627; 438/629; 438/696; 438/700; 438/702
[58] Field of Search ..................................... 438/639, 629, 438/696, 700, 702, 625, 627, FOR 405, FOR 388, FOR 199, FOR 182, 947, 238–240, 253–256, 381, 396–399

[56] References Cited

U.S. PATENT DOCUMENTS

| | | | |
|---|---|---|---|
| 5,244,534 | 9/1993 | Yu et al. | 156/636 |
| 5,262,352 | 11/1993 | Woo et al. | 438/639 |
| 5,279,989 | 1/1994 | Kim | 438/624 |
| 5,279,990 | 1/1994 | Sun et al. | 438/624 |
| 5,397,731 | 3/1995 | Takemura | 438/702 |
| 5,444,021 | 8/1995 | Chung et al. | 438/696 |
| 5,508,218 | 4/1996 | Jun | 438/254 |
| 5,525,552 | 6/1996 | Huang | 438/666 |
| 5,527,423 | 6/1996 | Neville et al. | 156/636.1 |
| 5,540,810 | 7/1996 | Sandhu et al. | 156/636.1 |
| 5,562,801 | 10/1996 | Nulty | 438/695 |
| 5,654,236 | 8/1997 | Kasai | 438/702 |
| 5,677,242 | 10/1997 | Aisou | 438/702 |
| 5,719,089 | 2/1998 | Cherng et al. | 438/700 |

OTHER PUBLICATIONS

Naokatsu Ikegami, Atsushi Yabata, Takayuki Matsui, Jun Kanamori and Yasuhiro Horiike; Characteristics of Very High Aspect–Ratio Contact Hole Etching; 1996 Dry Process Symposium; pp. 147–152.

*Primary Examiner*—Charles Bowers
*Assistant Examiner*—Thanh Nguyen

[57] ABSTRACT

The present invention provides a method of forming a opening in a semiconductor dielectric layer. In an advantageous embodiment, the method comprises the steps of forming a hardmask layer on the dielectric layer wherein the hardmask layer has an etch rate less than an etch rate of the dielectric layer, forming a guide opening through the hardmask layer, forming a spacer within the guide opening that reduces a diameter of the guide opening and forming the opening in the dielectric layer through the guide opening. The method may further include the steps of depositing a conductive material in the opening and guide opening and over at least a portion of the hardmask layer that extends beyond the guide opening, and removing the hardmask layer and the conductive material layer that extend beyond the guide opening. In certain embodiments, the contact opening may be formed to a width equal to or less than 0.25 μm.

25 Claims, 4 Drawing Sheets

METHOD FOR USING A HARDMASK TO FORM AN OPENING IN A SEMICONDUCTOR SUBSTRATE

TECHNICAL FIELD OF THE INVENTION

The present invention is directed, in general, to method of semiconductor fabrication, and more specifically to a method of using a hardmask to form an opening in a semiconductor substrate.

BACKGROUND OF THE INVENTION

It is well known that microcircuit fabrication requires the formation of precisely controlled openings, such as contact openings or vias, which are subsequently interconnected to create components and very large scale integration (VLSI) or ultra large scale integration (ULSI) circuits. Equally well known is that the patterns defining such openings are typically created by optical lithographic processes, which involve the use of a mask and radiation, such as ultraviolet light, electrons or x-rays, to expose a pattern in the photoresist material. The exposed patterns in the photoresist are formed when the wafer undergoes the subsequent development step. The exposed portion of the photoresist is removed and unexposed portions of the photoresist remains to protect the substrate regions that it covers. Locations from which photoresist has been removed can then be subjected to a variety of subsequent processing steps.

Formerly, in technologies involving features of greater than 0.5 microns, the degree of resolution was not as critical and longer wavelengths, such as those around 600 nm could be used. Accordingly, the equipment used in these conventional lithographic processes was developed to accommodate these design parameters.

In today's deep sub-micron technologies, however, the degree of resolution that can be achieved by such lithographic processes factor in consistently printing minimum size images has become even more critical in deep sub-micron circuits with features less than 0.5 $\mu$m. Thus, the fabrication of increasingly smaller features on VLSI or ULSI relies on the availability of increasingly higher resolution lithography equipment or processes. This higher resolution may be achieved in several ways. For example, the illuminating wavelength can be decreased, or the numerical aperture of the system lens can be increased. The contrast of the photoresist can also be increased, by modifying the photoresist chemistry, by creating entirely new resists, or by using contrast enhancement layers, which allows a smaller modulation transfer function to produce adequate images. Alternatively, the coherence of the optical system can be adjusted.

As features sizes have become smaller, difficulty in controlling the appropriate amount of photoresist exposure has increased due to stray light problems associated with patterning these smaller features. In some cases, over exposure of the desired photoresist area may occur, and in other cases, under exposure of the photoresist area may occur. In either case, critical dimension (CD) line width control becomes more difficult.

Accordingly, optical lithography for deep sub-micron integrated circuits with feature sizes less than 350 nm (0.35 $\mu$m) requires shorter wavelength exposure (365 nm or 248 nm) of the photoresist materials used for defining circuits. Most recently, new stepper lithography equipment has become available that uses shorter wavelengths to allow more precise exposure of a photoresist that is sensitive to the shorter wavelengths. With this new technology, smaller contact opening and via sizes can be obtained. However, this new stepper equipment is expensive and thus substantially increases the overall manufacturing cost of semiconductors.

Therefore, it is highly desirable to achieve the smaller contact openings and vias required by today's deep sub-micron technologies without the additional start-up costs associated with the new stepper technology and yet avoid the problems with inconsistent exposure of the photoresist.

SUMMARY OF THE INVENTION

To address the deficiencies of prior art methods, the present invention provides a method of forming a contact or via opening in a semiconductor dielectric layer. In an advantageous embodiment, the method comprises the steps of forming a hardmask layer on the dielectric layer wherein the hardmask layer has an etch rate less than an etch rate of the dielectric layer, forming a guide opening through the hardmask layer, forming a spacer within the guide opening such that it reduces the diameter of the guide opening, and forming the contact or via opening in the dielectric layer through the guide opening. In one embodiment, the spacer may be formed by the deposition of an amorphous silicon layer over the hardmask and in the guide opening and then by etching the amorphous silicon layer thereby to form the spacer within the guide opening. In another embodiment, the method may further include the steps of depositing a conductive material in the contact opening and guide opening and over at least a portion of the hardmask layer that extends beyond the guide opening, and removing at least a portion of the hardmask layer and the conductive material layer that extend beyond the guide opening. In certain embodiments, the contact opening may be formed to a width equal to or less than 0.25 $\mu$m.

The step of depositing the conductive material may include the steps of depositing a titanium layer in the contact opening, depositing a titanium nitride layer over the titanium layer, and depositing tungsten metal over the titanium nitride layer.

In another embodiment, the step of forming a guide opening includes the step of forming an oxide etch stop layer over the hardmask layer and may further include the step of forming silicon spacers in the guide opening prior to forming the contact opening.

In another embodiment, the step of removing may include the step of chemically and mechanically removing at least a portion of the hardmask and the conductive material. In one aspect of this particular embodiment, the step of chemically and mechanically removing the conductive material includes the step of removing the conductive material with a slurry comprising an abrasive and oxidizer. The abrasive may be comprised of aluminum oxide ($Al_2O_3$), and the oxidizer may be comprised of ferric nitrate or hydrogen peroxide.

In yet another embodiment, the step of chemically and mechanically removing the hardmask may include the step of removing the hardmask with a slurry comprising silica and a base. In one particular embodiment, the base may have a pH ranging from about 7 to about 11, and in another aspect of this particular embodiment, the base is selected from the group consisting of ammonia or potassium hydroxide.

In another embodiments, the step of forming the hardmask may include forming a silicon layer over the dielectric layer, which may be deposited to a thickness of 100 nm. In some of these embodiments, the silicon layer is comprised of polysilicon, or alternatively, the silicon may be comprised of amorphous silicon and in such instances, the step of

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
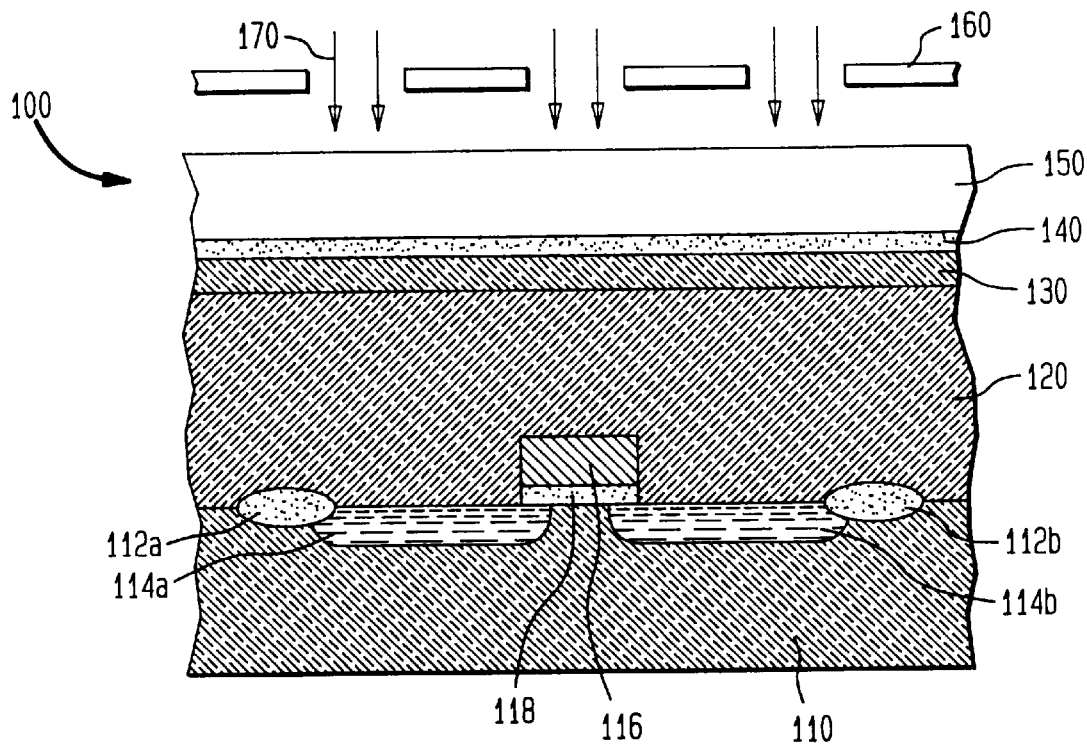
FIG. 1 illustrates an exemplary schematic cross-section of a typical metal oxide semiconductor device.

Referring initially to FIG. 1, illustrated is an exemplary schematic cross-section of a typical metal oxide semiconductor (MOS) device 100. As illustrated in FIG. 1, the semiconductor 100 includes a substrate 110, which may be formed from materials such as silicon, germanium, gallium arsenide or other materials known to those skilled in the art. The substrate 110 will typically include field oxide regions 112a, 112b and doped source and drain regions 114a, 114b, both of which are formed by conventional processes. A gate 116 positioned on a gate oxide 118 may also be formed on the substrate 110. Both the gate 116 and the gate oxide 118 are also formed by conventional processes. Deposited over the gate 116 and the substrate 110, is a dielectric layer 120. In advantageous embodiments, the dielectric layer 120 is deposited by conventional process using well known materials such as tetraethyl orthosilicate (TEOS). In another embodiment, the dielectric layer 120 is doped with phosphorous and/or boron.

Also shown is a hardmask layer 130 that is formed over the dielectric layer 120. In an advantageous embodiment, the hardmask layer 130 is composed of polysilicon with a thickness of approximately 100 nm and has an etch rate at least less than 1/10 of the etch rate of the dielectric layer 120 material. In another embodiment, the hardmask layer 130 is composed of amorphous silicon. The use of amorphous silicon, with its wider range of operational temperature, in the hardmask layer 130 allows the deposition of the hardmask layer 130 at a lower temperature, which is typically less than 580° C. Additionally, in an advantageous embodiment, the hardmask layer 130 is deposited on the dielectric layer 120 using chemical vapor deposition (CVD) at temperatures of approximately 400° C. to 500° C. The present invention does not limit the deposition process to CVD, other deposition techniques, such as sputtering and plasma enhanced processes, may also be used to deposit the hardmask layer onto the dielectric.

Following the deposition of the hardmask layer 130, an oxide etch stop layer 140, in an advantageous embodiment, may be deposited onto the hardmask layer 130 using conventional processes. The etch stop layer 140 is used as a barrier to prevent the etching process from penetrating past it. It should be noted that the use of the etch stop layer is not essential to the method disclosed by the present invention. A photoresist 150 is applied typically as a thin film to the etch stop layer 140 and subsequently exposed through a mask 160 in a conventional lithographic process. The mask 160 typically contains clear and opaque features that define an opening, such as a contact or via opening to be formed in the photoresist 150.

In a conventional exposure process, contact holes or via pattern are formed by plasma etch using the photoresist as a mask. The photoresist mask, however, is laterally eroded during the plasma etch and the resulting pattern size becomes larger than the original dimension. Consequently, patterning the small dimension becomes more difficult to achieve. Additionally, the deep ultraviolet (UV) photoresist used for the deep sub-micron photolithography has less resistance to plasma etch and results in even larger losses in critical dimension.

The hardmask layer 130 material is more resistant to the etching species than the photoresist 150 material and acts as a guide for etching the windows. With the use of the hardmask 130, the dimensions of the features being patterned with the mask 160 may be controlled with greater accuracy. The use of a hardmask as a control layer permits the use of existing conventional stepper lithographic equipment avoiding the costs of newer and more expensive stepper lithographic equipment that employ shorter wavelengths. After the photoresist is exposed to radiation (generally designated as 170), such as ultraviolet light, and developed, a semiconductor with an etched film pattern, as depicted in FIG. 2, is produced.

Figure 2:
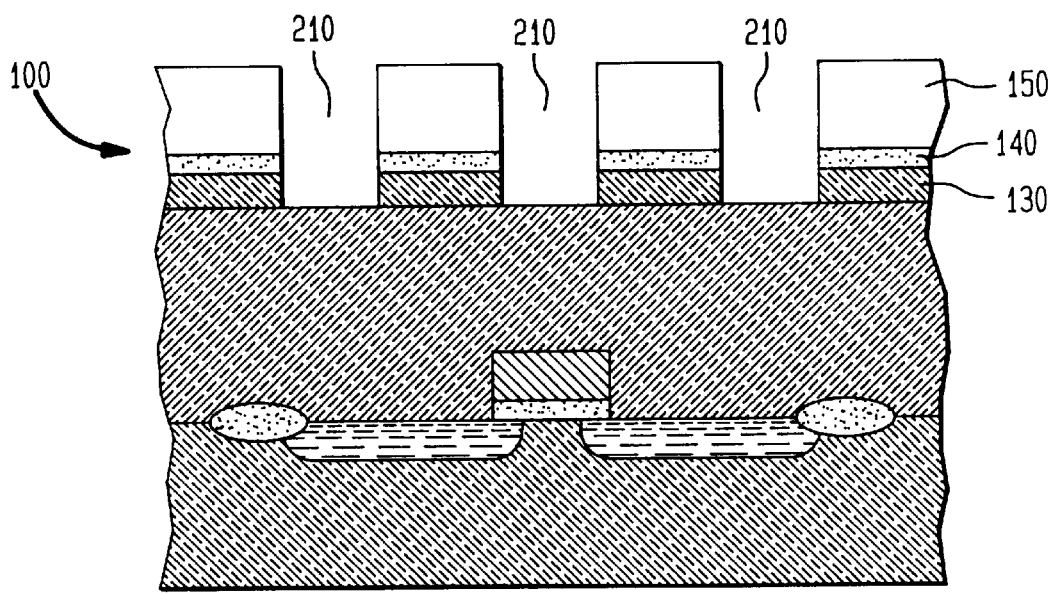
FIG. 2 illustrates the semiconductor depicted in FIG. 1 with an etched film pattern.

Turning now to FIG. 2, illustrated is the semiconductor 100 depicted in FIG. 1 with an etched film pattern. In an advantageous embodiment, the contact opening or via pattern is transferred to the photoresist 150 using conventional processes well known in the art. The exposed etch stop layer 140 and the hardmask layer 130 are patterned using conventional processes well known in the art to form a plurality of guide openings 210 through the hardmask layer 130, which corresponds to a plurality of contact openings or vias. The remaining photoresist 150 is then removed using conventional processes to expose the remaining hardmask layer 130.

Figure 3A:
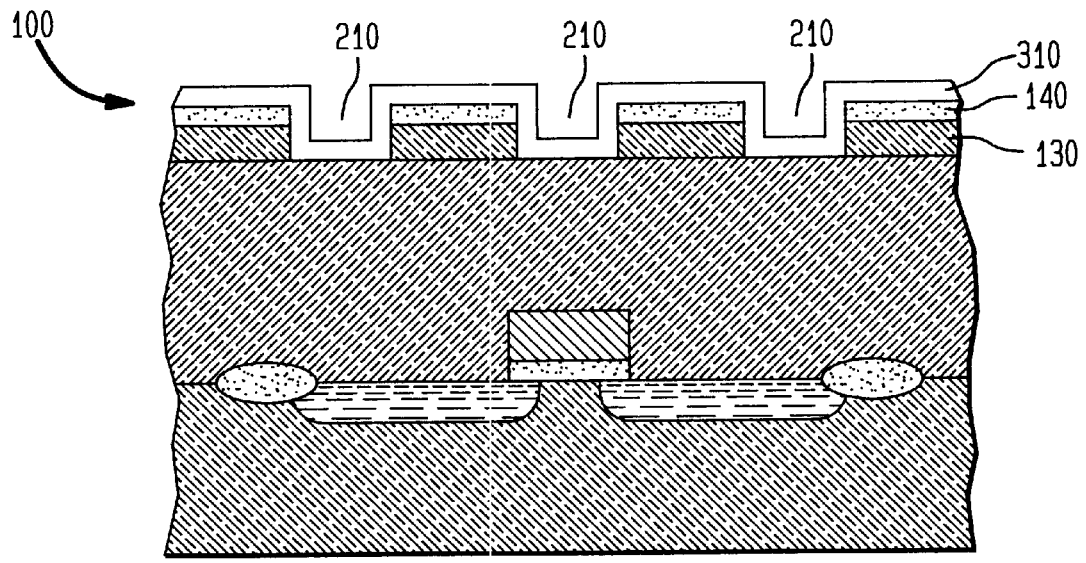
FIG. 3A illustrates the semiconductor depicted in FIG. 1 with a silicon film deposited over the remaining hardmask and etch stop layers.
Figure 3B:
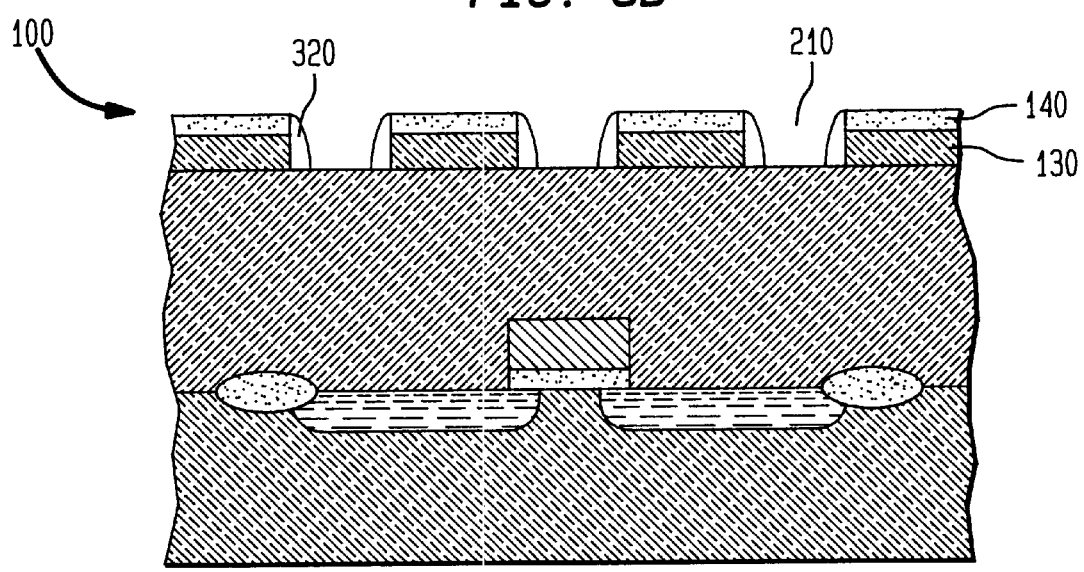
FIG. 3B illustrates the semiconductor depicted in FIG. 1 with silicon spacers.

Turning now to FIG. 3A and 3B, FIG. 3A illustrates the semiconductor 100 depicted in FIG. 1 with a silicon film 310 deposited over the remaining hardmask and etch stop layers 130,140. FIG. 3B illustrates the semiconductor 100 depicted in FIG. 1 with silicon spacers 320 formed from the silicon film 310. A silicon film 310 is deposited using conventional processes well known in the art. In an advantageous embodiment, a blanket and conformal amorphous silicon film 310 is deposited on the remaining etch stop layer 130 and in the guide openings 210. The amorphous silicon material is then subjected to an anisotropic (directional) reactive ion etch (RIE), forming an amorphous silicon spacer 320 within the guide opening 210 hardmask pattern. The resultant guide openings 210 are reduced by approximately twice the amorphous silicon thickness. Since the amorphous silicon deposition will typically not be isotropic, the side-wall (vertical surface) thickness will typically range from about 30% to 70% of the thickness of the amorphous silicon, as measured on a flat, i.e., horizontal, surface.

Figure 4:
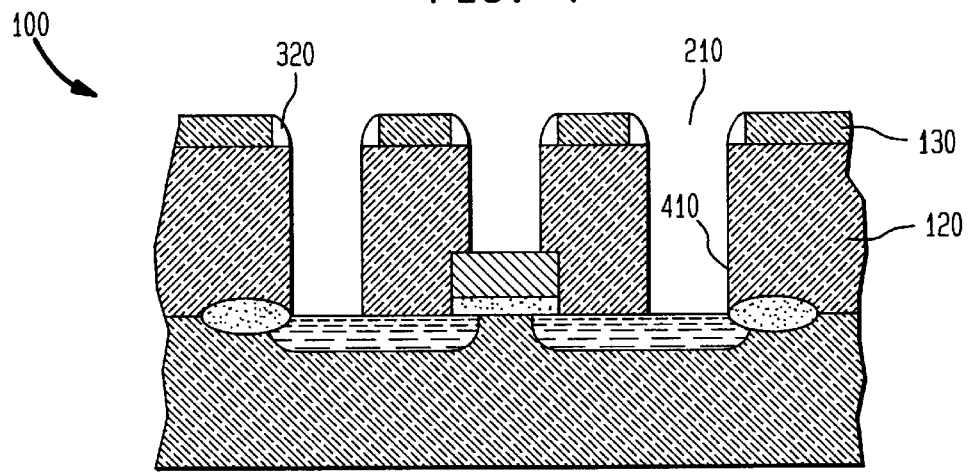
FIG. 4 illustrates the the semiconductor depicted in FIG. 1 with contact openings.

Turning now to FIG. 4, illustrated is the semiconductor 100 depicted in FIG. 1 with contact openings 410 formed in the dielectric 120. A plurality of contact openings (generally designated as 410) are formed using conventional processes through the guide openings 210 of the hardmask layer 130. The spacers 320 are used to control the size of the contact openings 410, allowing the use of conventional lithographic techniques to define feature sizes, e.g., contact openings or vias, of less than 0.25 µm. Following the formation of the contact openings 410, a barrier layer may be deposited in the contact openings 410 and on the hardmask layer 130 and silicon spacers 320 in a manner explained below.

Figure 5:
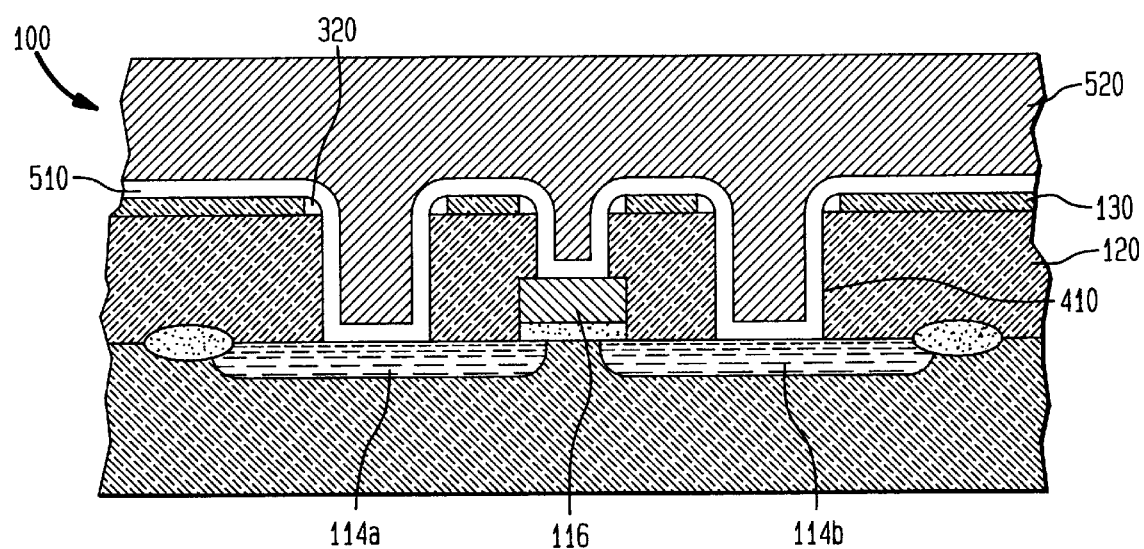
FIG. 5 illustrates the semiconductor depicted in FIG. 1 with a barrier layer and a conductive material.

Turning now to FIG. 5, illustrated is the semiconductor 100 depicted in FIG. 1 with a barrier layer 510 and a conductive material 520. In an advantageous embodiment, the barrier layer 510 is composed of titanium (Ti) and titanium nitride (TiN). The barrier layer 510 is formed over the hardmask layer 130, silicon spacers 320, and in the contact openings 410 by first depositing a layer of Ti using a conventional process, such as physical vapor deposition. Following the deposition of the Ti layer, a second layer of TiN is deposited, also using conventional processes well known in the art, over the first Ti layer.

After the formation of the barrier layer 510, a conductive material 520 is deposited, using conventional processes, over the barrier layer 510. In an advantageous embodiment, the conductive material is tungsten. The conductive material 520 is used to "plug" the contact openings 410 to provide electrical conductive paths from the source and drain regions 114a, 114b and gate 116 to a metal interconnect layer (not shown).

In preparation for the deposition of the metal interconnect layer, the silicon spacers 320, hardmask layer 130 along with the portions of the conductive material 520 and the barrier layer 510 that do not reside in the contact openings 410 are then removed. In an advantageous embodiment, a chemical mechanical polishing (CMP) process is employed. The CMP process is initiated with the removal of the conductive material 520. A slurry used for polishing the conductive material 520, which is typically tungsten, comprises an abrasive component and an oxidizer component. In an advantageous embodiment, aluminum oxide and ferric nitrate are used as the abrasive and oxidizer, respectively, in the slurry. In another embodiment, hydrogen peroxide is used as an oxidizer in the slurry. In the CMP process, the conductive material 520 is removed by a combination of physical, i.e., mechanical abrasion, and chemical, i.e., etching, processes. When the slurry and the CMP's pad (not shown) are pressed onto the conductive material 520, typically at pressures of approximately 6 to 8 psi, the oxidizing component of the slurry oxidizes the conductive material 520 to form a thin layer of metal oxide. This metal oxide is then readily removed with the slurry's abrasive component. The oxidizing and removal process is repeated until the hardmask layer 130 is reached, at which time a new slurry composition is employed. A new slurry is required because the silicon that is used to form the hardmask and spacers will not oxidize in ferric nitrate or hydrogen peroxide. The new slurry is comprised of silica and a base. In an advantageous embodiment, the slurry has a pH ranging from about 7 to about 11, and for example, the base may be ammonia or potassium hydroxide. With the new slurry, the CMP process continues until the hardmask layer 130 and the silicon spacers 320 are removed. At the conclusion of the CMP process, a metal interconnect layer may be deposited.

Figure 6:
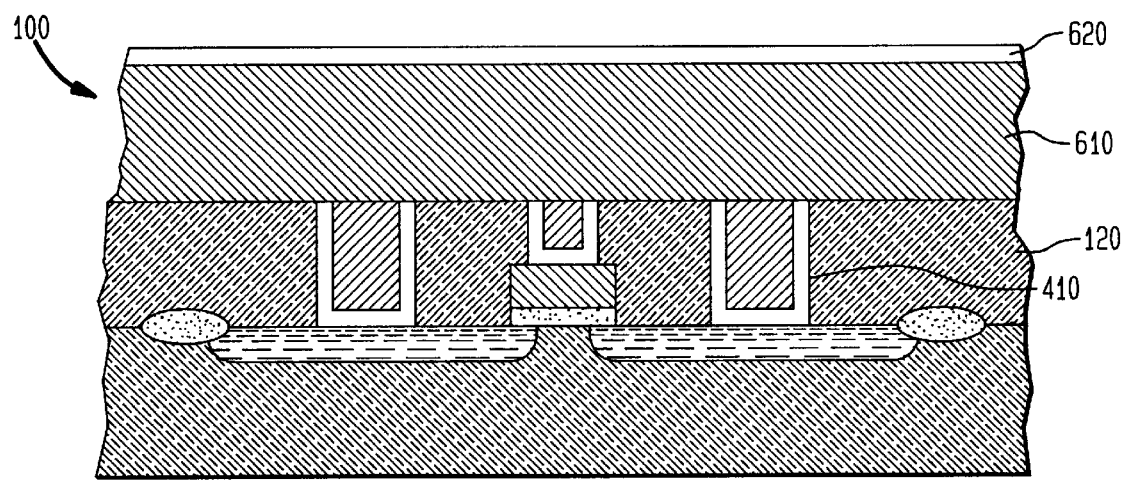
FIG. 6 illustrates the semiconductor depicted in FIG. 1 with a metal interconnect layer and an anti-reflective coating.

Turning now to FIG. 6, illustrated is the semiconductor 100 depicted in FIG. 1 with a metal interconnect layer 610 and an anti-reflective coating 620. The metal interconnect layer 610, which is typically comprised of aluminum, is deposited over the dielectric layer 120 and the contact openings 410 using conventional processes well known in the art, such as physical vapor deposition. The anti-reflective coating 620 is next deposited over the metal interconnect layer 610 also using conventional processes. The anti-reflective coating is used to absorb most of the radiation that might penetrate photoresist materials in subsequent lithographic processing steps. In an advantageous embodiment, the material used in the anti-reflective coating 520 is TiN.

From the above, it is apparent that the present invention provides a method of forming a contact opening in a semiconductor dielectric layer. The method disclosed by the present invention will achieve the smaller contact openings and vias required by current deep sub-micron technologies without requiring more sensitive photoresist materials and new stepper lithography equipment that uses shorter wavelengths. The foregoing has outlined, rather broadly, preferred and alternative features of the present invention so that those skilled in the art may better understand the detailed description of the invention as stated herein. Moreover, those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

What is claimed is:

1. A method of forming an opening in a semiconductor dielectric layer located over a transistor area of a semiconductor device, comprising:

forming an amorphous silicon hardmask layer on said dielectric layer, said amorphous silicon hardmask layer having an etch rate less than an etch rate of said dielectric layer;

forming a guide opening through said amorphous silicon hardmask layer;

forming an amorphous silicon spacer within said guide opening, said amorphous silicon spacer reducing an inside diameter of said guide opening;

forming said opening in said dielectric layer through said guide opening; and removing said amorphous silicon hardmask and said amorphous silicon spacer.

2. The method as recited in claim 1 wherein forming a guide opening includes the step of forming an oxide etch stop layer over said hardmask layer.

3. The method as recited in claim 1 wherein forming a spacer includes the step of forming a silicon spacer prior to forming said opening.

4. The method as recited in claim 1 further comprising:

depositing a conductive material in said opening and guide opening and over at least a portion of said hardmask layer that extends beyond said guide opening; and removing at least a portion of said hardmask layer and said conductive material layer that extends beyond said guide opening.

5. The method as recited in claim 4 wherein depositing a conductive material includes:

depositing a titanium layer in said opening;

depositing a titanium nitride layer over said titanium layer; and depositing tungsten metal over said titanium nitride layer.

6. The method as recited in claim 4 wherein removing includes chemically and mechanically removing at least a portion of said hardmask and said conductive material.

7. The method as recited in claim 6 wherein chemically and mechanically removing said conductive material includes removing said conductive material with a slurry comprising an abrasive and oxidizer.

8. The method as recited in claim 7 wherein removing with a slurry includes using aluminum oxide ($Al_2O_3$) as said abrasive and ferric nitrate or hydrogen peroxide as said oxidizer.

9. The method as recited in claim 6 wherein chemically and mechanically removing said hardmask includes the step of removing said hardmask with a slurry comprising silica and a base.

10. The method as recited in claim 9 wherein said base has a pH ranging from about 7 to about 11.

11. The method as recited in claim 9 wherein said base is selected from the group consisting of ammonia or potassium hydroxide.

12. The method as recited in claim 1 wherein forming said opening includes forming said opening to a width of equal to or less than 0.25 µm.

13. The method as recited in claim 1 wherein forming a spacer includes forming an amorphous silicon layer over said hardmask and in said guide opening and etching said amorphous silicon layer to form said spacer.

14. A method of forming a opening in a semiconductor oxide layer, comprising:
   forming an amorphous silicon layer on said oxide layer, said amorphous silicon layer having an etch rate less than an etch rate of said oxide layer;
   forming a guide opening through said amorphous silicon layer;
   forming an amorphous silicon spacer within said guide opening, said amorphous silicon spacer reducing an inside diameter of said guide opening;
   forming said opening in said oxide layer through said guide opening;
   depositing a metal layer in said opening and guide opening and over at least a portion of said amorphous silicon layer that extends beyond said guide opening; and
   removing said amorphous silicon layer and said metal layer that extend beyond said guide opening.

15. The method as recited in claim 14 wherein forming a guide opening includes forming a silicon dioxide etch stop layer over said amorphous silicon layer.

16. The method as recited in claim 14 wherein forming said amorphous silicon spacer includes the step of forming an amorphous silicon spacer prior to forming said opening.

17. The method as recited in claim 14 wherein depositing a metal layer includes:
   depositing a titanium layer in said opening;
   depositing a titanium nitride layer over said titanium layer; and
   depositing tungsten metal over said titanium nitride layer.

18. The method as recited in claim 14 wherein removing includes chemically and mechanically removing at least a portion of said amorphous silicon layer and said metal layer.

19. The method as recited in claim 18 wherein chemically and mechanically removing at least a portion of said metal layer includes removing at least a portion of said metal layer with a slurry comprising an abrasive and oxidizer.

20. The method as recited in claim 19 wherein removing with a slurry includes using aluminum oxide ($Al_2O_3$) as said abrasive and ferric nitrate or hydrogen peroxide as said oxidizer.

21. The method as recited in claim 19 wherein chemically and mechanically removing at least a portion of said amorphous silicon layer includes removing at least a portion of said amorphous silicon layer with a slurry comprising silica and a base.

22. The method as recited in claim 21 wherein said base has a pH ranging from about 7 to about 11.

23. The method as recited in claim 21 wherein said base is selected from the group consisting of ammonia or potassium hydroxide.

24. The method as recited in claim 14 wherein forming said opening includes forming said opening to a width of equal to or less than 0.25 µm.

25. The method as recited in claim 14 wherein forming an amorphous silicon spacer includes the step of forming an amorphous silicon layer over said amorphous silicon layer and in said guide opening and etching said amorphous silicon layer to form said amorphous silicon spacer.

* * * * *